Aug. 12, 1969 C. E. HOUPIS ET AL 3,461,399
OSCILLATOR WITH SHORT CIRCUIT LOAD PROTECTION
Filed Sept. 15, 1967
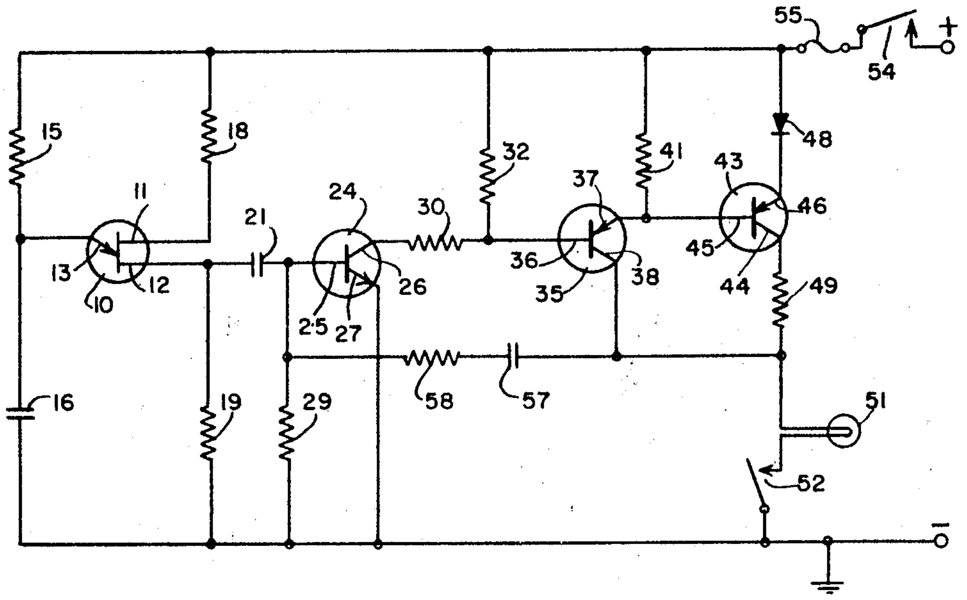
Inventors
CONSTANTINOS E. HOUPIS
MARTIN IVEC
BY Mueller, Aichele & Rauner
ATTYS.

United States Patent Office 3,461,399
Patented Aug. 12, 1969

3,461,399
OSCILLATOR WITH SHORT CIRCUIT LOAD PROTECTION

Constantinos E. Houpis, Chicago, and Martin Ivec, Joliet, Ill., assignors to Motorola, Inc., Franklin Park, Ill., a corporation of Illinois Filed Sept. 15, 1967, Ser. No. 668,024
Int. Cl. H02h *7/20;* H03k *3/26*
U.S. Cl. 331—62 4 Claims

ABSTRACT OF THE DISCLOSURE

A pulse generator triggers an amplifier which provides power to an output load. A regenerative feedback circuit in the amplifier includes a series coupled capacitance and resistance to provide a time constant for regulating the on time of the amplifier. The feedback circuit acts to turn off the amplifier if the load becomes short circuited. The feedback circuit is connected to the load in such a manner that no feedback signal can be generated with the load short circuited.

Background of the invention

Because of the sensitivity of transistors to excessive current it is desirable to provide some form of protection against abnormally high current loads caused by a short circuited load. This is particularly true in high current applications where short circuits are possible. An example of such a circuit is a heavy duty turn signal and four way flashing unit used on motor vehicles.

Conventional protection circuits such as crowbar and current sensing circuits are ineffective for lamp loads driven by the turn signal flashing units because of the cold to hot resistance change of the load (and because of the oscillating nature of the load current). Because of the wide variation in current drawn by lamp loads these conventional protection circuits are not effective.

Summary of the invention

It is, therefore, an object of this invention to provide a short circuit load protection circuit operative to protect circuits having large variations in load current.

Another object of this invention is to provide a short circuit load protection circuit operative to protect the oscillator.

In practicing this invention a short circuit protection circuit is provided for an oscillator having a pulse generator for developing a series of timing pulses. The timing pulses are differentiated to decrease the duration of the pulses and applied to an amplifier to turn on the amplifier. The amplifier is coupled to the load to provide current to the load.

The differentiated timing pulses are of sufficiently short duration so that they will not bias the transistor amplifier to conduction for a period long enough to damage the transistor when the load is short circuited. A feedback circuit, coupled from the output of the amplifier to its input, acts to rapidly turn on the amplifier in response to the initial conduction caused by the timing pulses. The feedback circuit includes resistance and capacitance which maintain the amplifier in a conductive state for a period of time determined by the time constant of the feedback circuit independently of the duration of the timing pulses. Short circuiting of the load, with the amplifier conducting, provides a pulse to the input of the amplifier of the proper polarity to turn off the amplifier to prevent damage to the output transistor. Further, the short circuited load prevents the generation of a feedback signal of sufficient amplitude so that the amplifier on subsequent timing pulses is turned on only for the duration of the timing pulse which is too short a period of time to cause damage to the amplifier.

The invention is illustrated in the single drawing, a schematic of the circuit incorporating the features of this invention.

Description of the invention

In the single figure an oscillator incorporating the features of this invention is shown. In operation ignition switch 54 is closed and a positive potential is applied to the circuit through fuse 55. Closing switch 52 connects the lamp load 51 to the power supply for energization thereof.

Unijunction transistor 10 is normally biased to nonconduction so that the potential on base I, 12, is at ground potential. Capacitor 16 charges through resistor 15 until the potential on emitter 13 of unijunction transistor 10 reaches a firing potential. When unijunction transistor 10 fires current flows from the positive terminal through resistor, base II, 11, base I, 12 of unijunction transistor 10, and resistor 19 to the negative terminal. The charge on the capacitor 16 discharges through the emitter 13, and base I, 12 of unijunction transistor 10, and resistor 19 to the negative terminal. This flow of current through resistor 19 develops a timing pulse across resistor 19. When capacitor 16 discharges through unijunction transistor 10 the unijunction transistor 10 turns off. Thus the time interval between the timing pulses is determined by the RC time constant of resistor 15 and capacitor 16.

The timing pulses are applied to base 25 of transistor 24 through a differentiating circuit consisting of capacitor 21 and resistor 29. The differentiating circuit develops a sharp positive pulse at the beginning of the pulse developed across resistor 19. The positive pulse applied to base 25 of transistor 24 biases transistor 24 to conduction so that a current flows from the positive supply potential through resistors 32 and 30, collector 26, emitter 27 to the negative terminal. The flow of current through resistor 32 causes a drop in the bias potential applied to base 36 of transistor 35 biasing transistor 35 to conduction. Collector 38 of transistor 35 is connected to collector 44 of transistor 43 through a very small resistance 49 which acts as a current limiting resistor. Emitter 37 of transistor 35 is connected to base 45 of transistor 43 and emitter 46 of transistor 43 is coupled to the positive power supply through diode 48. Resistor 41 connects emitter 37 of transistor 35 to the positive power supply. Thus, transistors 35 and 43 are connected as direct coupled amplifiers.

The transistors 35 and 43 both conduct, when the potential applied to base 36 of transistor 35 drops, to supply a current to load 51. The flow of current through load 51 develops a potential across the load which is coupled through capacitor 57 and resistor 58 to base 25 of transistor 24 further biasing this transistor into conduction. The regenerative action of the positive feedback provided by capacitor 57 and resistor 58 rapidly biases transistor 24 to saturation which in turn causes transistors 35 and 43 to be biased to saturation.

When capacitor 57 is fully charged the forward bias potential is removed from base 25 to transistor 24 and the conduction of transistor 24 begins to drop. The drop in conduction through transistor 24 causes the conduction through transistor 43 to drop thus reducing the potential across load 51. This drop in potential is coupled back to base 25 of transistor 24 through capacitor 57 and resistor 58 causing transistor 24 to be rapidly biased to nonconduction. With transistor 24 biased to non-conduction transistor 43 is also biased to non-conduction and the current to load 51 is cutoff. Thus the duration of the pulse of current supplied to load 51 is determined by the time constant of the feedback network consisting of capacitor 57 and resistor 58.

If load 51 is short circuited while a current is supplied to the load, that is with transistor 43 conducting, there will be a sudden drop in the potential across the load. This sudden drop in potential is applied as a negative potential to base 25 of transistor 24 causing transistor 24 to be biased to non-conduction. Thus if the load is short circuited, while current is being supplied to it, a turnoff voltage is applied to transistor 24 biasing off transistors 24, 35 and 43 and cutting off the current supplied to the load. A subsequent differential timing pulse applied to base 25 will partially bias transistor 24 to conduction and cause transistor 43 to be partially biased to conduction. However, the differentiated timing pulses are sufficiently short so that the amplifier transistors are not damaged by momentarily supplying current to a short circuited load.

Thus a short circuit protection circuit for an oscillator has been shown which acts to turn off the current supplied to the load when the load is short circuited. The circuit further acts to restrict the on time and the amount of current supplied to the load to a safe level while the load is short circuited.

What is claimed is:

1. An oscillator circuit having short circuit protection including in combination, pulse generation means for developing a series of timing pulses, transistor amplifying means including an input terminal coupled to said pulse generation means and an output terminal, a load coupled to said output terminal, and feedback means including series coupled capacitor means and resistor means coupling said output terminal to said input terminal, said transistor amplifying means being responsive to said timing pulses to become conductive whereby a current is supplied to said load and a potential developed across said load, said timing pulses being of substantially shorter time duration than the conductive time of said transistor amplifying means and of sufficiently short duration whereby said transistor amplifying means is not damaged with said load being a short circuit, said feedback means being responsive to said potential greater than a first predetermined amplitude to provide a feedback signal to prolong said conduction of said transistor amplifying means for a period determined by the time constant of said resistor means and said capacitor means, said capacitor means being responsive to the reduction of said potential below a second predetermined amplitude to develop a turn off signal and apply the same to said input terminal the transistor of said transistor amplifying means being of polarity types whereby said turn off signal acts to bias said transistor means to non-conduction.

2. The oscillator circuit of claim 1 wherein, said pulse generation means includes differentiation means coupled to said input terminal and acting to differentiate said timing pulses, said differentiated timing pulses acting to render a said transistor amplifying means conductive and being of sufficiently short duration whereby said amplifying means is not damaged with said load being a short circuit, short circuiting of said load further acting to prevent said potential from reaching said first predetermined amplitude to prevent a generation of said feedback signal, whereby said transistor amplifying means is conductive only for said short duration.

3. The oscillator circuit of claim 2 wherein, said feedback means includes a resistor and a capacitor series connected between said input and output terminals.

4. The oscillator circuit of claim 3 wherein, said a transistor amplifier means includes a first transistor of one polarity coupled to said input terminal, circuit means coupled to said first transistor forming therewith a common emitter amplifier, second and third transistors of a polarity opposite to said one polarity, said third transistor being coupled to said output terminal, and said second transistor coupling said first transistor to said third transistor for supplying a driving current thereto.

References Cited

UNITED STATES PATENTS 3,244,995 4/1966 Barditch et al. -------- 330—26

JOHN KOMINSKI, Primary Examiner

U.S. Cl. X.R.

330—11, 20, 26; 331—75, 111